United States Patent
Bu et al.

(10) Patent No.: US 11,106,889 B2
(45) Date of Patent: Aug. 31, 2021

(54) BIOMETRIC SENSOR, DISPLAY APPARATUS, AND METHOD OF FABRICATING BIOMETRIC SENSOR

(71) Applicants: BEIJING BOE DISPLAY TECHNOLOGY CO., LTD., Beijing (CN); BOE Technology Group Co., Ltd., Beijing (CN)

(72) Inventors: Qianqian Bu, Beijing (CN); Weibin Hu, Beijing (CN)

(73) Assignees: BEIJING BOE DISPLAY TECHNOLOGY CO., LTD., Beijing (CN); BOE Technology Group Co., Ltd., Beijing (CN)

( * ) Notice: Subject to any disclaimer, the term of this patent is extended or adjusted under 35 U.S.C. 154(b) by 186 days.

(21) Appl. No.: 16/462,281

(22) PCT Filed: May 17, 2018

(86) PCT No.: PCT/CN2018/087338
§ 371 (c)(1),
(2) Date: May 20, 2019

(87) PCT Pub. No.: WO2019/218315
PCT Pub. Date: Nov. 21, 2019

(65) Prior Publication Data
US 2021/0117638 A1    Apr. 22, 2021

(51) Int. Cl.
*G06K 9/00* (2006.01)
*G06F 1/16* (2006.01)
*H01L 31/0232* (2014.01)

(52) U.S. Cl.
CPC ......... *G06K 9/0004* (2013.01); *G06F 1/1684* (2013.01); *H01L 31/02327* (2013.01)

(58) Field of Classification Search
CPC ................ G06K 9/0004; G06F 1/1684; H01L 31/02327
See application file for complete search history.

(56) References Cited

U.S. PATENT DOCUMENTS

| | | |
|---|---|---|
| 5,621,516 A | 4/1997 | Shinzaki et al. |
| 2015/0371074 A1 | 12/2015 | Lin |

(Continued)

FOREIGN PATENT DOCUMENTS

| | | |
|---|---|---|
| CN | 104318199 A | 1/2015 |
| CN | 105280650 A | 1/2016 |

(Continued)

OTHER PUBLICATIONS

International Search Report & Written Opinion dated Feb. 18, 2019, regarding PCT/CN2018/087338.

(Continued)

*Primary Examiner* — Alexander Eisen
*Assistant Examiner* — Kebede T Teshome
(74) *Attorney, Agent, or Firm* — Intellectual Valley Law, P.C.

(57) ABSTRACT

The present application provides a biometric sensor. The biometric sensor includes a first base substrate; a second base substrate facing the first base substrate; a plurality of photosensors on the first base substrate and configured to detect at least a portion of a light totally reflected by a surface of the second base substrate facing away the first base substrate, thereby detecting a biometric information; a low refractive index layer on a side of the plurality of photosensors distal to the first base substrate; and a high refractive index layer on a side of the low refractive index layer distal to the first base substrate and directly adjacent to the low refractive index layer. The high refractive index layer includes a material having a refractive index higher (Continued)

than a refractive index of a material of the low refractive index layer.

19 Claims, 9 Drawing Sheets

(56) References Cited

U.S. PATENT DOCUMENTS

| | | |
|---|---|---|
| 2016/0013229 A1 | 1/2016 | Tu et al. |
| 2016/0224819 A1 | 8/2016 | Kim et al. |
| 2016/0238439 A1 | 8/2016 | Chu et al. |
| 2016/0266695 A1* | 9/2016 | Bae .................. G06F 3/04166 |
| 2017/0062769 A1 | 3/2017 | Kim et al. |
| 2017/0228576 A1* | 8/2017 | Kim .................. G06K 9/0004 |
| 2018/0211079 A1* | 7/2018 | Liu .................. G06K 9/0004 |
| 2018/0211085 A1 | 7/2018 | Liu et al. |
| 2019/0236327 A1 | 8/2019 | Jia et al. |
| 2019/0251326 A1 | 8/2019 | Sun |
| 2020/0279979 A1* | 9/2020 | Lee .................. H01L 25/0753 |

FOREIGN PATENT DOCUMENTS

| | | | | |
|---|---|---|---|---|
| CN | 105678255 A | | 6/2016 | |
| CN | 105723381 A | | 6/2016 | |
| CN | 105895641 A | | 8/2016 | |
| CN | 106355136 A | * | 1/2017 | ........... G06K 9/0002 |
| CN | 106486523 A | | 3/2017 | |
| CN | 107045625 A | | 8/2017 | |
| CN | 107122750 A | | 9/2017 | |
| CN | 107194303 A | | 9/2017 | |
| CN | 107220630 A | | 9/2017 | |
| CN | 107330426 A | | 11/2017 | |
| CN | 107563318 A | | 1/2018 | |

OTHER PUBLICATIONS

First Office Action in the Chinese Patent Application No. 201880000419.3, dated Jun. 17, 2021; English translation attached.

B. Nie, "optical fiber communication", Beijing Institute of Technology Press, Jan. 2010, pp. 82-83.

* cited by examiner

BIOMETRIC SENSOR, DISPLAY APPARATUS, AND METHOD OF FABRICATING BIOMETRIC SENSOR

CROSS-REFERENCE TO RELATED APPLICATION

This application is a national stage application under 35 U.S.C. § 371 of International Application No. PCT/CN2018/087338, filed May 17, 2018, the contents of which are incorporated by reference in the entirety.

TECHNICAL FIELD

The present invention relates to biometric sensing technology, particularly, to a biometric sensor, a display apparatus, and a method of fabricating a biometric sensor.

BACKGROUND

In recent years, various methods have been proposed in fingerprint and palm print recognition. Examples of optical method for recognizing fingerprint and palm print include total reflection method, light-path separation method, and scanning method. In a total reflection method, light from a light source such as ambient light enters into a pixel, and is totally reflected on the surface of a package substrate. When a finger or palm touches the display panel, the total reflection condition of the surface changes locally upon touch, leading to a disruption of the total reflection locally. The disruption of the total reflection results in a reduced reflection. Based on this principle, the ridge lines of a finger may be differentiated from the valley lines. Alternatively, fingerprint and palm print may be recognized by detecting changes in capacitance when a finger or palm touches the display panel.

SUMMARY

In one aspect, the present invention provides a biometric sensor, comprising a first base substrate; a second base substrate facing the first base substrate; a plurality of photosensors on the first base substrate and configured to detect at least a portion of a light totally reflected by a surface of the second base substrate facing away the first base substrate, thereby detecting a biometric information; a low refractive index layer on a side of the plurality of photosensors distal to the first base substrate; and a high refractive index layer on a side of the low refractive index layer distal to the first base substrate and directly adjacent to the low refractive index layer, the high refractive index layer comprising a material having a refractive index higher than a refractive index of a material of the low refractive index layer, wherein the low refractive index layer and the high refractive index layer are configured to exclude a portion of a reflected light reflected by the surface of the second base substrate facing away the first base substrate having an angle of incidence with respect to an interface between the low refractive index layer and the high refractive index layer outside a threshold range from entering into the plurality of photosensors.

Optionally, the biometric sensor further comprises a plurality of light blocking walls, each of which surrounding a lateral side of one of the plurality of photosensors to prevent light from emitting out of the lateral side.

Optionally, each of the light blocking walls, comprises a Bragg reflector comprising at least a first stab-layer of a high refractive index and a second sub-layer of a law refractive index surrounding the lateral side of the one of the plurality of photosensors, the first sub-layer comprising a material having a refractive index higher than a refractive index of a material of the second sub-layer; and the first sub-layer is between the second sub-layer and the lateral side of the one of the plurality of photosensors.

Optionally, the first sub-layer comprises hafnium oxide and the second sub-layer comprises silicon oxide.

Optionally, each of the light blocking walls comprises a light absorbing polymer material.

Optimally, the low refractive index layer comprises a plurality of concave lenses configured to diffuse at least a portion of the reflected light reflected by the surface of the second base substrate facing away the first base substrate and transmitted toward the plurality of photosensors; the high refractive index layer comprises a material having a refractive index higher than a refractive index of a material of the plurality of concave lens; the plurality of concave lenses and the high refractive index layer are configured to exclude the portion of the reflected light reflected by the surface of the second base substrate facing away the first base substrate liming the angle of incidence with respect to an interface between the plurality of concave lenses and the high refractive index layer outside the threshold range from entering into the plurality of photosensors; and each of the plurality of concave lenses is between one of the plurality of photosensors and the high refractive index layer.

Optionally, the biometric sensor further comprises art intermediate layer on a side of the low refractive index layer distal to the high refractive index layer, the plurality of concave lenses comprise a material having a refractive index higher than a refractive index of a material of the intermediate Layer, and each of the plurality of concave lenses is on a side of the intermediate layer distal to one of the plurality of photosensors.

Optionally, the plurality of concave lenses and the intermediate layer are configured to exclude a light transmitted through the plurality of concave lenses from entering into the plurality of photosensors.

Optionally, the bionic sensor further comprises an array of a plurality of thin film transistors on the first base substrate and respectively connected to the plurality of photosensors; a common electrode configured to be provided with a common voltage signal; and a plurality of read lines for respectively transmitting signals detected by the plurality of photosensors.

Optionally, the common electrode is a substantially transparent electrode.

Optionally, each of the plurality of photosensors comprises a first polarity region connected to the common electrode, a second polarity region connected to a source electrode of one of the plurality of thin film transistors, and a diode junction connecting the first polarity region and the second polarity region, and each of the plurality of thin film transistors comprises a source electrode connected to a second polarity region of one of the plurality of photosensors, and a drain electrode connected to one of the plurality of read lines.

Optionally, the biometric sensor farther comprises a light source configured to emit a light irradiating along a direction from the first base substrate toward the second base substrate, at least a portion of the light being totally reflected by a surface of the second base substrate facing away the first base substrate.

Optionally, each of the plurality of photosensors is a PIN photodiode comprising a first polarity region, a second polarity region, and a diode junction connecting the first polarity region and the second polarity region; wherein the first polarity region is a P+ doping semiconductor region, the second polarity region is an N+ doping semiconductor region, and the diode junction is an intrinsic region of amorphous silicon between the P+ doping semiconductor region and the N+ doping semiconductor region.

Optionally, the high refractive index layer is a passivation layer.

Optionally, the low refractive index layer and the high refractive index layer are configured to exclude at least a portion of a diffusely reflected light reflected by the surface of the second base substrate facing away the first base substrate having an angle of incidence with respect to the interface between the low refractive index layer and the high refractive index layer outside a threshold range from entering into the plurality of photosensors, and configured to allow at least a portion of the light totally reflected by the surface of the second base substrate facing away the first base substrate having an angle of incidence with respect to the interface between the low refractive index layer and the high refractive index layer within the threshold range to enter into the plurality of photosensors.

Optionally, the biometric sensor is a finger print sensor configured to detect a finger print, and the biometric information is a finger print information.

In another aspect, the present invention provides a display apparatus comprising the biometric sensor described herein or fabricated by a method described herein.

Optionally, the display apparatus has a plurality of subpixels; and each of the plurality of photosensors corresponds to one of the plurality of subpixels.

Optionally, the display apparatus has a subpixel region and an inter-subpixel region; and the plurality of photosensors are in the inter-subpixel region.

In another aspect, the present invention provides a method of fabricating a biometric sensor, comprising providing a first base substrate; providing a second base substrate facing the first base substrate; forming a plurality of photosensors on the first base substrate and configured to detect at least a portion of a light totally reflected by a surface of the second base substrate facing away the first base substrate, thereby detecting a biometric information; forming a low refractive index layer on a side of the plurality of photosensors distal to the first base substrate; and forming a high refractive index layer on a side of the low refractive index layer distal to the first base substrate and directly adjacent to the low refractive index layer, the high refractive index layer is made of a material having a refractive index higher than a refractive index of a material of the low refractive index layer; wherein the low refractive index layer and the high refractive index layer are formed to exclude a portion of a reflected light reflected by the surface of the second base substrate facing away the first base substrate having an angle of incidence with respect to an interface between the low refractive index layer and the high refractive index layer outside a threshold range from entering into the plurality of photosensors.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive cc to be limited to the precise form disclosed.

Figure 1:
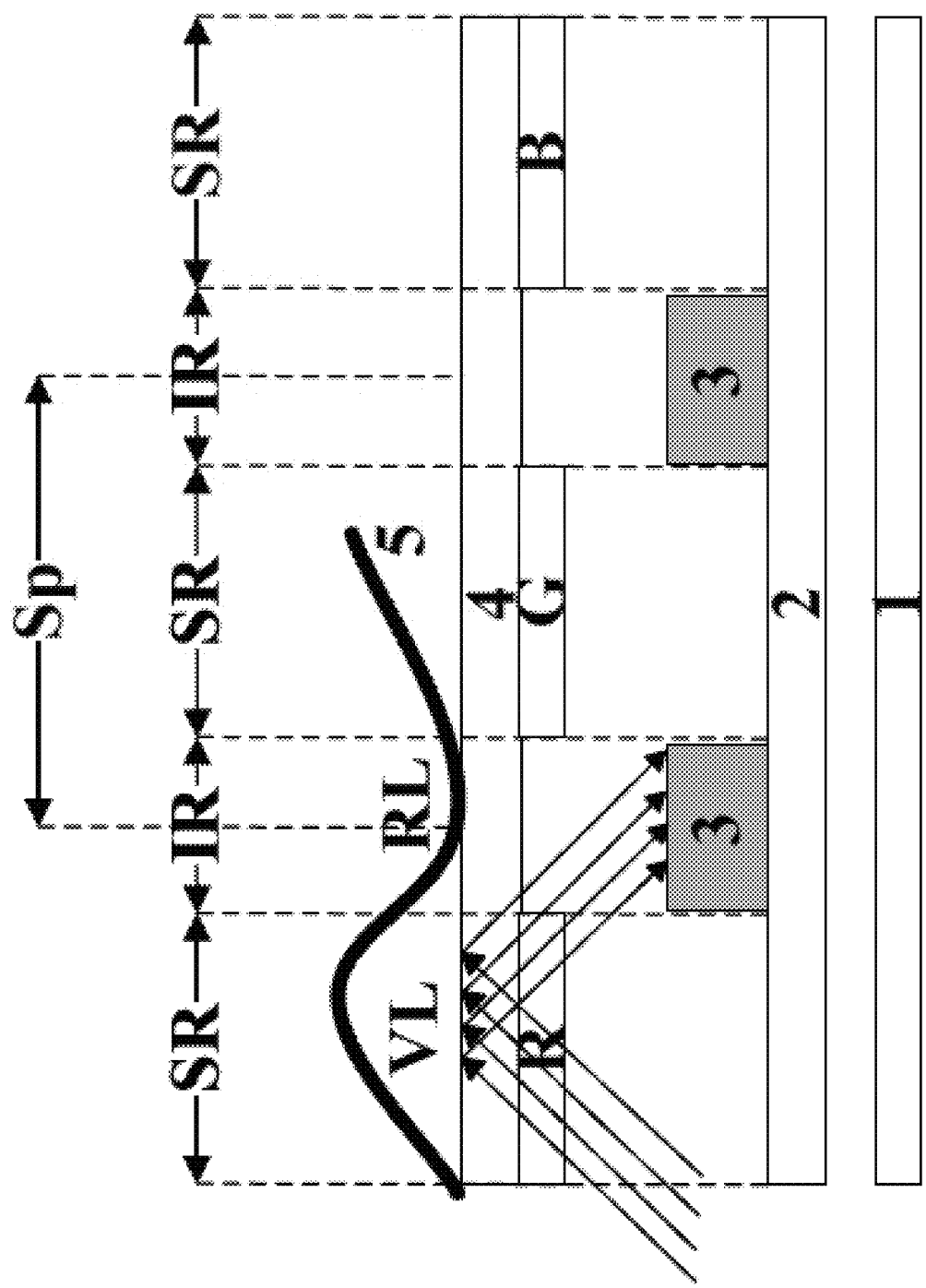
FIG. 1 is a schematic diagram illustrating the structure of a display apparatus having a biometric sensor in some embodiments according to the present disclosure.
Figure 2:
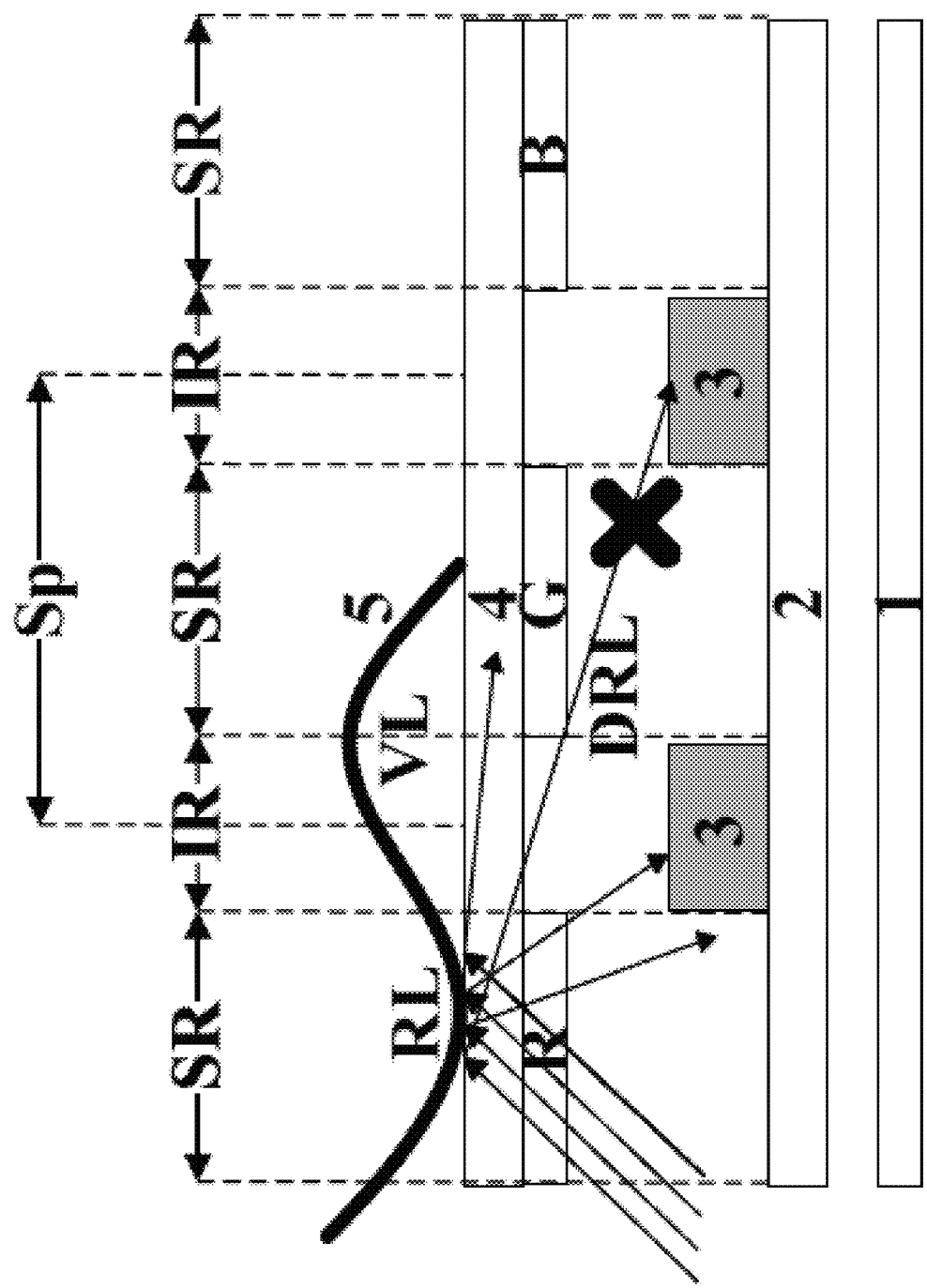
FIG. 2 is a schematic diagram illustrating the structure of a display apparatus having a biometric sensor in some embodiments according to the present disclosure.

FIG. 1 is a schematic diagram illustrating the structure of a display apparatus having a biometric sensor in scone embodiments acorn-ding to the present disclosure. FIG. 2 is a schematic diagram illustrating the structure of a display apparatus having a biometric sensor in some embodiments according to the present disclosure. Referring to FIG. 1 and FIG. 2, the display apparatus in some embodiments includes a plurality of subpixels Sp. The display apparatus has a subpixel region SR and an inter-subpixel region IR spacing apart the subpixel region SR. In some embodiments, the display apparatus includes a first base substrate 2, a second base substrate 4 facing the first base substrate 2, and a plurality of photosensors 3 on the first base substrate 2. The display apparatus optionally further includes a plurality of color fibers (e.g., including a red color it block R, a green color filter block G, and a blue color filter block B) in the subpixel region SR. Optionally, the plurality of photosensors 3 are in the inter-subpixel region IR.

As used herein, a subpixel region refers to a light emission region of a subpixel, such as a region corresponding to a pixel electrode in a liquid crystal display, a region corresponding to a light emissive layer in an organic light emitting diode display panel, or a region corresponding to the light transmission layer in the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel Optionally, the subpixel region is a light emission region of a blue color subpixel. Optionally, the subpixel region is a light emission region of a white color subpixel. As used herein, an inter-subpixel region refers to a region between adjacent subpixel regions, such as a region corresponding to a black matrix in a liquid crystal display, a region corresponding a pixel definition layer in an organic light emitting diode display panel, or a black matrix in the present display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

The display apparatus further includes a light source 1 provided for emitting a light irradiating along a direction from the first base substrate 2 toward the second base substrate 4. As shown in FIG. 1, at least a portion of the light from the light source 1 is reflected by, e.g., totally reflected by, a surface of the second base substrate 4 facing away the first base substrate 2. When a finger (or palm) is placed on the side of the second base substrate 4 facing away the first base substrate 2, a finger print 5 (or a palm print) can be detected. As shown in FIG. 1, the finger print 5 has a plurality of ridges lines RL and a plurality of valley lines VL. Light emitted from the light source 1 irradiates the plurality of valley lines VL and the plurality of ridge lines RL of the finger print 5 (or the palm print). Due to the difference between the plurality of valley lines VL and the plurality of ridge lines RL in the reflection angle and the intensity of reflected light, the light projected onto the plurality of photosensors 3 can produce different electrical currents, so that the plurality of valley lines VL and the plurality of ridge lines RL of the finger print 5 (or the palm print) can be recognized.

Referring to FIG. 1, light irradiation on one of the plurality of valley lines VL is depicted Because the finger (or the palm) is not in touch with the screen surface (the side of the second base substrate 4 facing away the first base substrate 2) in regions corresponding to the plurality of valley lines VL, total reflection conditions in these regions remain intact (for maniple, the medium on a side of the second base substrate 4 distal to the first base substrate 2 is air). As shown in FIG. 1, light irradiates on the surface of the second base substrate 4 facing away the first base substrate 2 in the regions corresponding to the plurality of valley lines VL, and (at least a portion of) light is totally reflected by the surface of the second base substrate 4 facing away the first base substrate 2. The plurality of photosensors 3 detect the light totally reflected by the surface of the second base substrate 4 faring away the first base substrate 2 in the regions corresponding to the plurality of valley lines VL.

Referring to FIG. 2, light irradiation on one of the plurality of ridge lines RL is depicted. Because the finger (or the palm) is in touch with the screen surface (the side of the second base substrate 4 facing away the first base substrate 2) in regions corresponding to the plurality of ridge lines RL, total reflection conditions in these regions are disrupted (for example, the medium on a side of the second base substrate 4 distal to the first base substrate 2 is not air but finger). As shown in FIG. 2, light irradiates on the surface of the second base substrate 4 facing away the first base substrate 2 in the regions corresponding to the plurality of ridge limn RL, diffused reflection occurs on the interface, thereby generating a diffused reflected light DRL transmitting along various directions. The one of plurality of photosensors 3 most proximal to the one of the plurality of ridge lines RL detects much less reflected light as compared to the one corresponding to the one of the plurality of valley flint VL Thus, the plurality of ridge lines RL and plurality of valley lines VL can be differentiated and recognized. However, as shown in FIG. 2, at least a portion of the diffusely reflected light DRL irradiates on an adjacent one of the plurality of photosensors 3, and is detected by the adjacent one of the plurality of photos 3. This affects detection accuracy and sensitivity.

The present disclosure provides a biometric sensor having enhanced biometric detection accuracy and sensitivity. In some embodiments, the biometric sensor according to the present disclosure is configured to at least partially prevent the diffusely reflected light DPL from being detected by the adjacent one of the plurality of photosensors 3. For example, the biometric sensor is capable of excluding a portion of the diffusely reflected light DPI from entering into the adjacent one of the plurality of photosensors 3. The biometric information can be detected with much enhanced accuracy and sensitivity.

Accordingly, the present disclosure provides, inter olio, a biometric sensor, a display apparatus, and a method of fabricating a biometric sensor that substantially obviate one or more of the problems due to limitations and disadvantages of the related art. In one aspect, the present disclosure provides a biometric sensor. In some embodiments, the biometric sensor includes a first base substrate; a second base substrate facing the first base substrate; a plurality of photosensors on the first base substrate and configured to detect at least a portion of the light totally reflected by the surface of the second base substrate facing away the first base substrate, thereby detecting a biometric information; a low refractive index layer on a side of the plurality of photosensors distal to the first base substrate; and a high refractive index layer on a side of the low refractive index layer distal to the first base substrate and directly adjacent to the low refractive index layer, the high refractive index layer comprising a material having a refractive index higher than a refractive index of a material of the low refractive index layer. The low refractive index layer and the high refractive index layer Erwin an interface. On the high refractive index layer side of the interface, the high refractive index layer has a refractive index n1. On the low refractive index layer side of the interface, the low refractive index layer has a refractive index n2, and n2<n1. Thus, the low refractive index layer and the high refractive index layer are configured to exclude a portion of a reflected light reflected by the surface of the second base substrate faring away the first base substrate having an angle of incidence with respect to an interface between the low refractive index layer and the high refractive index layer outside a threshold range from entering into the plurality of photosensors, and configured to allow at least a portion of the light totally reflected by the surface of the second base substrate facing away the first base substrate having an angle of incidence with respect to the interface between the low refractive index layer and the high refractive index layer within the threshold range to enter into the plurality of photosensors.

Optionally, the low refractive index layer and the high refractive index layer are configured to exclude at least a portion of a diffusely reflected light reflected by the surface of the second base substrate acing away the first base substrate having an angle of incidence with respect to an interface between the low refractive index layer and the high refractive index layer outside the threshold range from entering into the plurality of photosensors, and configured to allow at least a portion of the light reflected by (e.g., totally reflected by) the surface of the second base substrate acing away the first base substrate having an angle of incidence with respect to an interface between the low refractive index layer and the high refractive index layer within the threshold range to enter into the plurality of photosensors. Optionally, the diffusely reflected light is a light reflected by the surface of the second base substrate facing away the first base substrate in regions corresponding to a plurality of valley lines. Optimally, the diffusely reflected light is light reflected by the surface of the second base substrate facing away the first base substrate in regions corresponding to a plurality of valley lines in adjacent subpixels corresponding to one or more adjacent photosensors of the plurality of photosensors.

Figure 3:
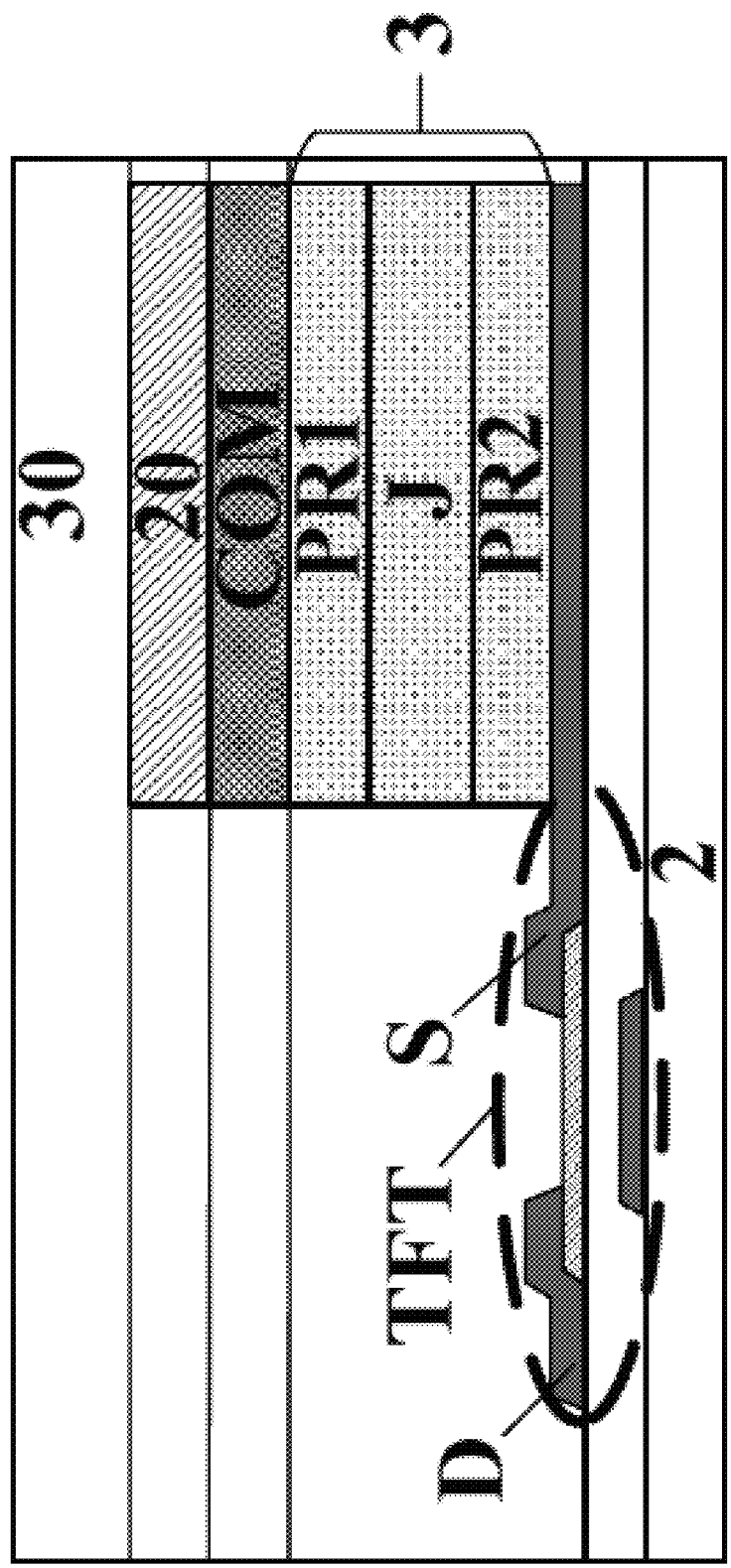
FIG. 3 is a schematic diagram illustrating the structure of a biometric sensor in some embodiments according to the present disclosure.

FIG. 3 is a schematic diagram illustrating the structure of a biometric sensor in some embodiments according to the present disclosure Referring to FIG. 3, the biometric sensor in some embodiments includes a low refractive index layer 20 on a side of the plurality of photosensors 3 distal to the first base substrate 2, and a high refractive index layer 30 on a side of the low refractive index layer 20 distal to the first base substrate 2 and directly adjacent to the low refractive index layer 20. The high refractive index layer 30 is made of a material having a refractive index higher than a refractive index of a material of the low refractive index layer 20. As discussed above in connection with FIG. 1 and FIG. 2, the plurality of photosensors 3 are configured to detect the at least a portion of the light reflected by (e.g., totally reflected by) the surface of the second base substrate 4 facing away the first base substrate 2, thereby detecting a biometric information. In some embodiments, the low refractive index layer 20 and the high refractive index layer 30 are configured to exclude at least a portion of the light reflected by the surface of the second base substrate facing away the first base substrate having an angle of incidence with respect to an interface between the low refractive index layer and the high refractive index layer outside a threshold range from entering into the plurality of photosensors 3. Optionally, the law refractive index layer 20 and the high refractive index layer 30 are configured to exclude at least a portion of the diffusely reflected light reflected by the surface of the second base substrate facing away the first base substrate having an angle of incidence with respect to an interface between the low refractive index layer and the high refractive index layer outside a threshold range from entering into the plurality photosensors 3, the diffusely reflected light being reflected by the surface of the second base substrate in regions corresponding to a plurality of ridge lines of a finger print.

Figure 4:
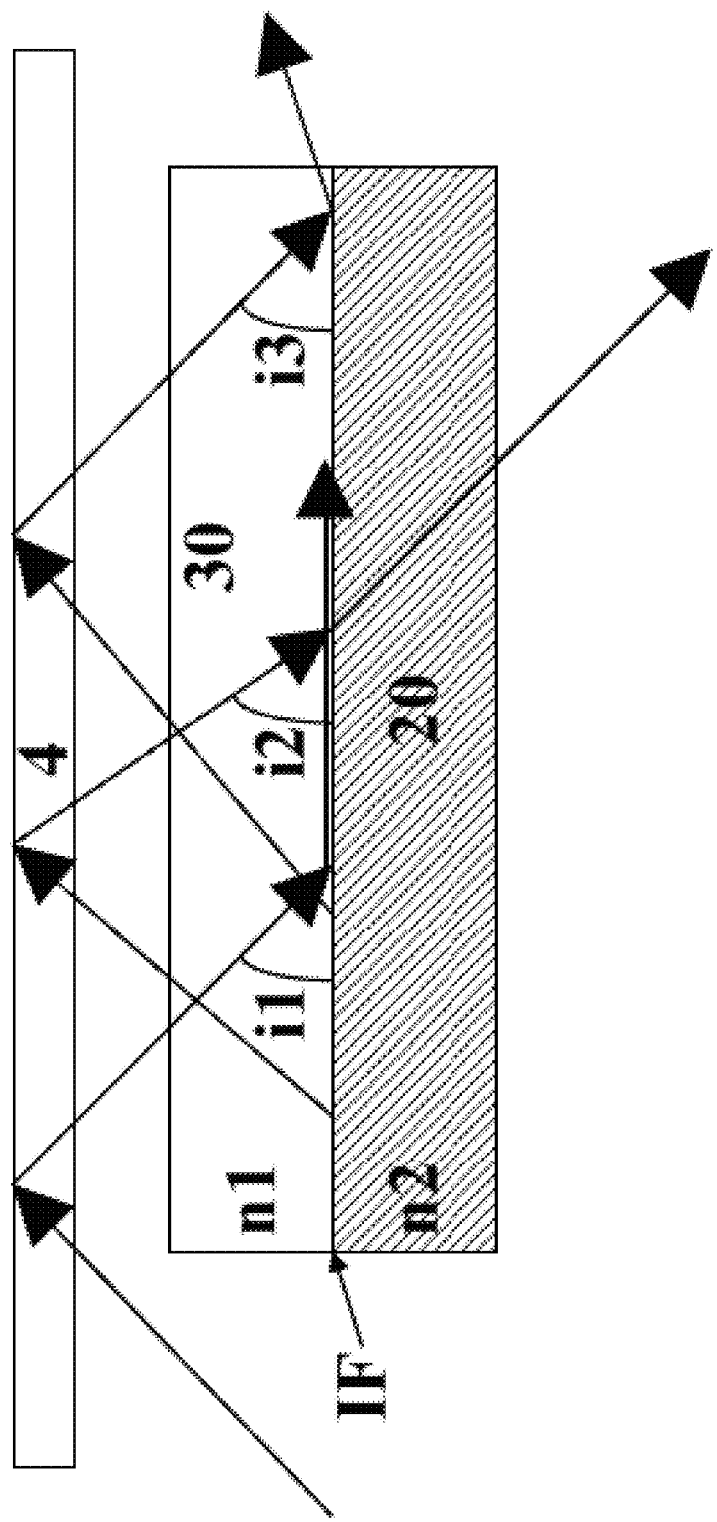
FIG. 4 is a diagram illustrating a light path at an interface between a low refractive index layer and a high refractive index layer in sow embodiments according to the present disclosure.

FIG. 4 is a diagram illustrating a light path at an interface between a low refractive index layer and a high refractive index layer in some embodiments according to the present disclosure. Referring to FIG. 4, the high refractive index layer 30 has a refractive index of n1, the low refractive index layer 20 has a refractive index of n2. The high refractive index layer 30 is directly adjacent to the low refractive index layer 20 thereby forming an interface IF. A light is reflected (e.g., diffusely reflected) on the surface of the second base substrate 4, and transmits into the high refractive index layer 30. The light has an angle of incidence i1 with respect to the interface IF between the low refractive index layer 20 and the high refractive index layer 30, and is reflected at the interface IF along a direction substantially parallel to the interface IF. A light is reflected (e.g., diffusely reflected) on the surface of the second base substrate 4, and transmits into the high refractive index layer 30. The light has an angle of incidence i2 with respect to the interface IF between the low refractive index layer 20 and the high refractive index layer 30, and enters into the low refractive index layer 20 to be subsequently detected by one of the plurality of photosensors 3. A light is reflected (e.g., diffusely reflected) on the surface of the second base substrate 4, and transmits into the high refractive index layer 30. The light has an angle of incidence i3 with respect to the interface IF between the low refractive index layer 20 and the high refractive index layer 30, and is reflected at the interface IF along a direction at an angle larger than zero with respect to the interface IF. The angle of incidence i1 is a threshold angle of incidence. The light having an angle of incidence with respect to the interface IF between the low refractive index layer 20 and the high refractive index layer 30 outside a threshold range, e.g., less than the threshold angle of incidence i1, is prevented from entering into the plurality of photosensors 3. The light having an angle of incidence with respect to the interface IF between the low refractive index layer 20 and the high refractive index layer 30 within the threshold range, e.g., greater than the threshold angle of incidence i1, is allowed to enter into the plurality of photosensors 3. The threshold angle of incidence i1 can be determine according to Equation (1):

$$i1 = \frac{\pi}{2} - \arc\sin\frac{n_2}{n_1}; \qquad (1)$$

wherein n1 is the refractive index of the high refractive index layer 30, n2 is the refractive index of the low refractive index layer 20.

Various appropriate optical clear materials may be used for making the low refractive index layer 20 and the high refractive index layer 30. In some embodiments, the high refractive index layer 30 is a passivation layer. Examples of appropriate materials for molting the high refractive index layer 30 include polyimide, silicon oxide ($SiO_y$), silicon nitride ($SiN_y$, e.g., $Si_3N_4$), silicon oxynitride ($SiO_xN_y$), a material including phosphorus pentoxide and silicon dioxide ($P_2O_5$—$SiO_2$), niobium oxide, titanium oxide, and tantalum oxide. Examples of appropriate materials for making the low refractive index layer 20 include silicon dioxide and magnesium fluoride. Regardless the specific choice of the transparent optical materials for the sub-layers, the materials for making the low refractive index layer 20 have a refractive index less than that for making the high refractive index layer 30. For example, silicon dioxide has a refractive index of 1.4585, and magnesium fluoride has a refractive index of 1.3777. Niobium oxide has a refractive index of 2.3404, titanium oxide has a refractive index of 2.6142, tantalum oxide has a refractive index of 11306, nitride has a refractive index of 2.0458. Silicon oxynitride has a refractive index that can be tuned between approximately 1.46 to approximately 2.0, depending on the ratio of oxygen and nitrogen in the compound.

Optionally, the refractive index for the high refractive index layer 30 is greater than that of the low refractive index layer 20 by at least 15%, e.g., by at least 20%, by at least 25% or by at least 30%. Optionally, the refractive index of the high refractive index layer 30 is no less than 1.55. Optionally, the refractive index of the low refractive index layer 20 is less than 1.5.

In some embodiments, the high refractive index layer 30 is made of a material including $SiO_xN_y$, wherein x>0, and y>0. Optionally, the refractive index of the high refractive index layer 30 is in a range of approximately 1.46 to approximately 2.0. Optionally, the refractive index of the high refractive index layer 30 is in a range of approximately LS to approximately 2.0. Optionally, the refractive index of the high refractive index layer 30 is approximately 1.9. Optionally, the low refractive index layer 20 is made of silicon dioxide. Optionally, the low refractive index layer 20 is made of magnesium fluoride.

Figure 5:
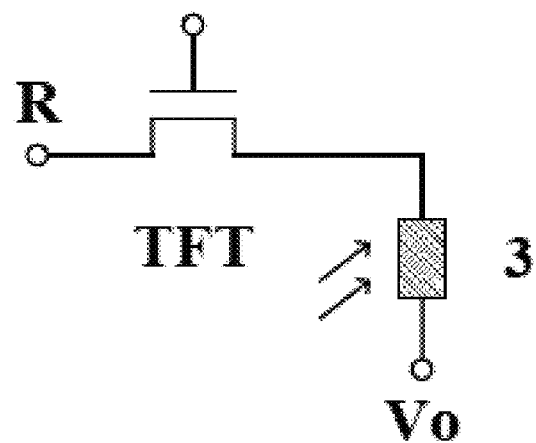
FIG. 5 is a circuit diagram of a photo-sensing circuit in some embodiments according to the present disclosure.

FIG. 5 is a circuit diagram of a photo-sensing circuit in some embodiments according to the present disclosure. Referring to FIG. 3 and FIG. 5, each photo-sensing circuit includes one of a plurality of thin film transistors TFTs electrically connected to one of the plurality of photosensors 3. The source electrode of the one of the plurality of thin film transistors TFTs is electrically connected to a first terminal of the one of the plurality of photosensors 3. The drain electrode of the one of the plurality of the thin film transistors TFTs is electrically connected to one of a plurality of read line R. A second terminal of the one of the plurality of photosensors 3 is provided with a common voltage $V_0$ (e.g., a low voltage, e.g. −5 V to 0 V).

Various appropriate photosensors having a diode junction may be utilized in making and using the present display apparatus. In some embodiments, the photosensor is a photosensor having a diode junction. Examples of photosensors having a diode junction include, but are not limited to, a PN photodiode, a PIN photodiode, an avalanche photodiode, a MIM diode junction, a MIS diode junction, a MOS diode junction, a SIS diode junction, and a MS diode junction.

Referring to FIG. 3, each of the plurality of photosensors 3 in some embodiments includes a first polarity region PR1 connected to a common electrode COM, a second polarity region PR2 connected to a source electrode S of one of the plurality of thin film transistors TFTs, and a diode junction 1 connecting the first polarity region PR1 and the second polarity region PR2. As used herein, the term diode junction refers to a junction that can exhibit current rectification, e.g., a junction that exhibits drastically different conductivities in one bias direction relative to the other.

Optionally, each of the plurality of photosensors 3 having a diode junction includes a first polarity region having a first dopant, a second polarity region having a second decant and a diode junction connecting the first polarity region and the second polarity region. Optionally, each of the plurality of photosensors 3 having a diode junction is reversely biased when the first polarity region is connected to a low voltage and the second polarity region is connected to a high voltage. For example, the photosensor having a diode junction is in a reversely biased state when the first polarity region is connected to a common electrode (low voltage, e.g., −5 V to 0 V). In some embodiments, each of the plurality of photosensors 3 having a diode junction is a PN photodiode having a P+ doping semiconductor region as the first polarity region and an N+ doping semiconductor region as the second polarity region. In some embodiments, each of the plurality of photosensors 3 having a diode junction is a PIN photodiode having a P+ doping semiconductor region as the first polarity region, an N+ doping semiconductor region as the second polarity region, and an intrinsic region of amorphous silicon between the P+ doping semiconductor region and the N+ doping semiconductor region.

Figure 6A:
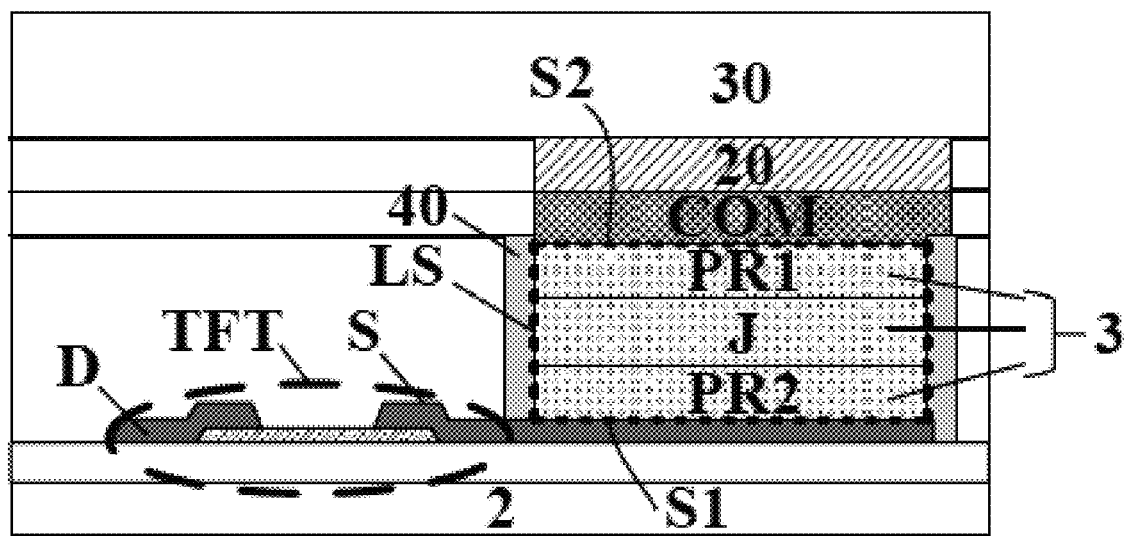
FIG. 6A is a schematic diagram illustrating the structure of a biometric sensor in some embodiments according to the present disclosure.

FIG. 6A is a schematic diagram illustrating the structure of a biometric sensor in some embodiments according to the present disclosure. Referring to FIG. 6A, the biometric sensor in some embodiments further includes a plurality alight blocking walls 40, each of which surrounding a lateral side LS of one of the plurality of photosensors 3 to prevent light from emitting out of the lateral side LS. For example, each of the plurality of photosensors 3 has a first side S1 facing the first base substrate 2, a second side S2 opposite to the first side S1 and facing away the first base substrate 2. The lateral side LS connect the first side S1 and the second side S2.

Figure 6B:
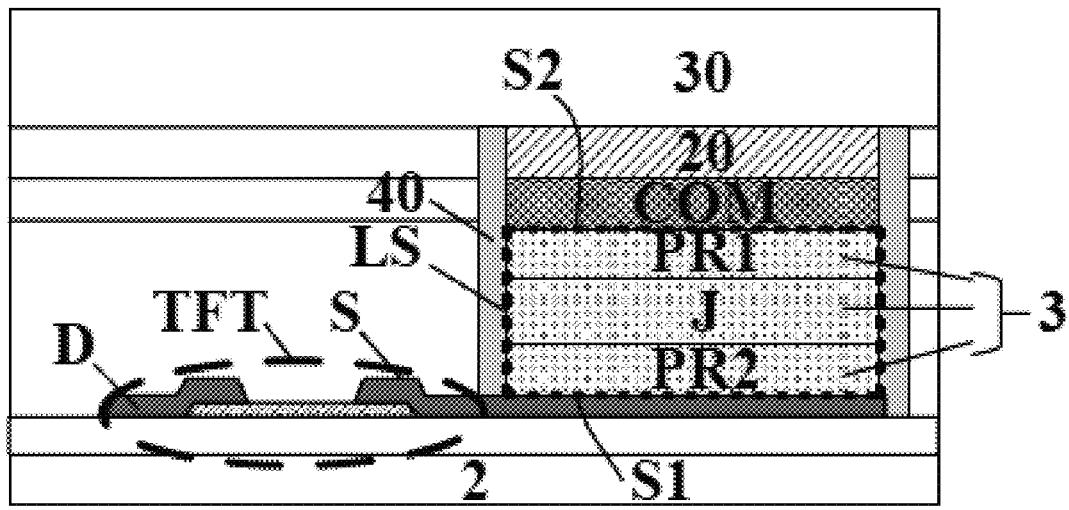
FIG. 6B is a schematic diagram illustrating the structure of a biometric sensor in some embodiments according to the present disclosure.

FIG. 6B is a schematic diagram illustrating the structure of a biometric sensor in some embodiments according to the present disclosure. Referring to FIG. 6B, in some embodiments, each of the plurality of light blocking walls 40 not only surrounds the lateral side LS of one of the plurality of photosensors 3, but also surround lateral skim of a common electrode COM and the low refractive index layer 20.

In some embodiments, the plurality of light blocking walls 40 are formed so that each of the plurality of light blocking walls 40 surrounds the lateral side LS of one of the plurality of photosensors 3 and the lateral side of the common electrode COM, but does not surround the lateral side of the low refractive index layer 20.

Various appropriate materials may be used for making the plurality of light blocking walls 40. In one example, each of the light blocking walls 40 includes a light absorbing polymer material, e.g., a black material for absorbing light. In another example, each of the light blocking walls 40 includes a Bragg reflector having at least a first sub-layer of a high refractive index and a second sub-layer of a low refractive index surrounding the lateral side LS of the one of the plurality of photosensors 3. The first sub-layer includes a material having a refractive index higher than a refractive index of a material of the second sub-layer. The first sub-layer is between the second sub-layer and the lateral side LS of the one of the plurality of photosensors 3. Optionally, the first sub-layer includes hafnium oxide and the second nib-layer includes silicon oxide.

Optionally, the Bragg reflector includes a plurality of high refractive index sub-layers and a plurality of low refractive index sub-layers alternately arranged, e.g., having a LS-HL . . . HL structure, wherein LS is the lateral side of the one of the plurality of photosensors 3, H stands for a sub-layer having a high refractive index, and L stands far a sub-layer having a low refractive index. Optimally, the H sub-layer includes hafnium oxide and the L sub-layer includes silicon oxide.

Figure 7:
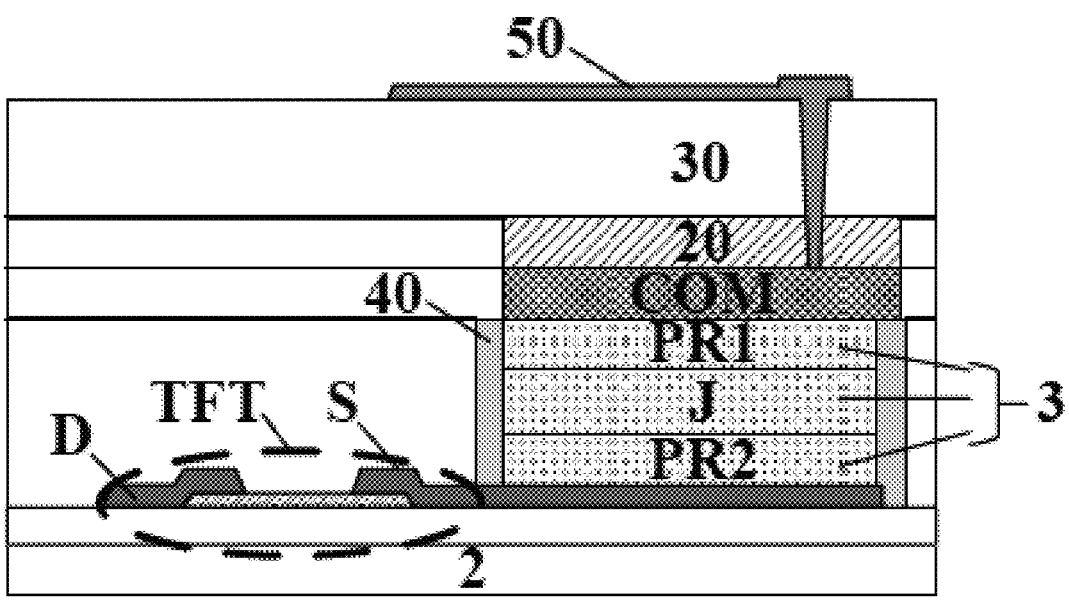
FIG. 7 is a schematic diagram illustrating the structure of a biometric sensor in some embodiments according to the present disclosure.

FIG. 7 is a schematic diagram illustrating the structure of a biometric sensor in some embodiments according to the present disclosure Referring to FIG. 7, the biometric sensor in some embodiments further includes a common voltage signal line 50 connected to the common electrode COM. The common electrode signal line 50 extends through the high refractive index layer 30 and the low refractive index layer 20 through a via extending there-through. Various appropriate electrode materials may be used for tasking the common, electrode COM. Examples of appropriate electrode materials include indium tin oxide, nano-silver, graphene, carbon nanotubes, and so on. In some embodiments, the common electrode COM is a substantially transparent electrode. As used herein, the term. "substantially transparent" means at least 50 percent (e.g., at least 60 percent, at least 70 percent, at least 80 percent, at least 90 percent, and at least 95 percent) of light in the visible wavelength range transmitted there-through.

Figure 8A:
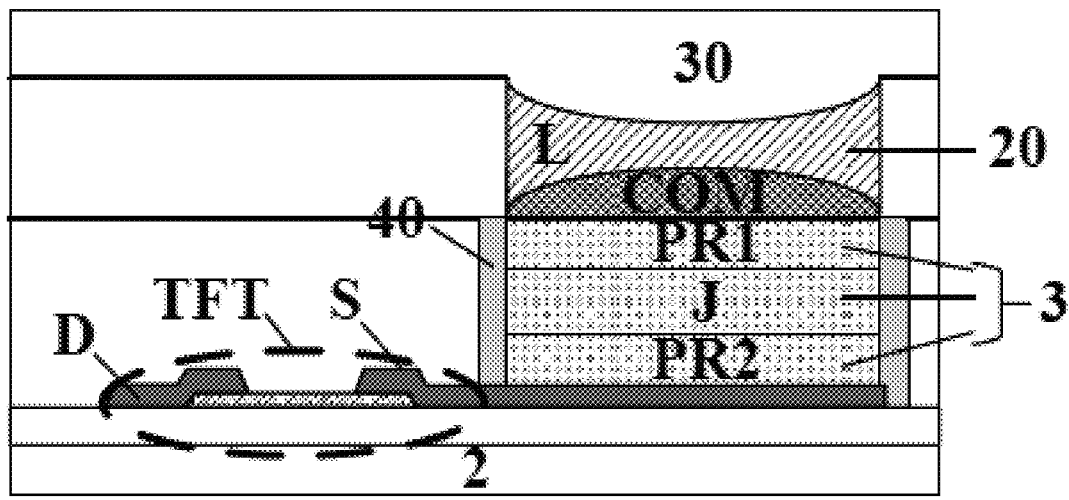
FIG. 8A is a schematic diagram illustrating the structure of a biometric sensor in some embodiments according to the present disclosure.
Figure 9:
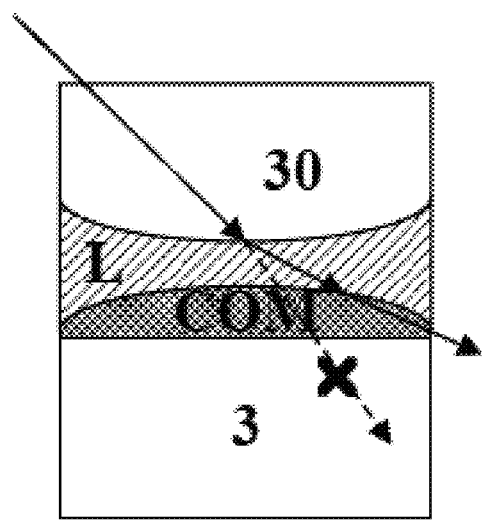
FIG. 9 is a schematic diagram illustrating a light diffused by one of the plurality of concave lenses in some embodiments according to the present disclosure.

FIG. 8A is a schematic diagram illustrating the structure of a biometric sensor in some embodiments according to the present disclosure. Referring to FIG. 8A, the low refractive index layer 20 include a plurality of concave lenses L configured to diffuse at least a portion of the light reflected by the surface of the second base substrate facing away the first base substrate 2 and transmitted toward the plurality of photosensors 3 so that the at least a portion of the light diffused by the plurality of concave lenses L is prevented from entering into the plurality of photosensors 3. FIG. 9 is a schematic diagram illustrating a light diffused by one of the plurality of concave lenses in some embodiments according to the present disclosure. Referring to FIG. 9, a reflected light reflected by the surface of the second base substrate faring away the first base substrate transmits through the interface between the high refractive index layer 30 and one of the plurality of concave lenses L along a direction toward one of the plurality of photosensors 3. As shown in FIG. 9, the light is diffused by the one of the plurality of concave lenses L, the diffused light is prevented from entering into the one of the plurality of photosensors 3.

Thus, the plurality of concave lenses L exclude a portion of the reflected light reflected by the surface of the second base substrate facing away the first base substrate from entering into the plurality of photosensors 3 by a combination of at least two mechanisms. The first mechanism is due to the difference between refractive indexes of the high refractive index layer 30 and the plurality of concave lenses L, as discussed in details above (e.g., in connection with FIG. 4). In some embodiments, the high refractive index layer 30 is made of a material having a refractive index higher than a refractive index of a material of the plurality of concave lenses L Referring to FIG. 8A, the plurality of concave lenses L and the high refractive index layer 30 are configured to exclude the portion of the reflected light reflected by the surface of the second base substrate facing away the first base substrate 2 having the angle of incidence with respect to an interface between the plurality of concave lenses L and the high refractive index layer 30 outside a threshold range from entering into the plurality of photosensors 3. The threshold angle and the threshold range can be determined as discussed in connection with FIG. 4. Optionally, each of the plurality of concave lenses L is between one of the plurality of photosensors 3 and the high refractive index layer 30. Even if the angle of incident is within the threshold range; and the light is allowed to enter into the plurality of concave lenses L, the light entered into the plurality of concave lenses L is further diffused by the plurality of concave lenses L, e.g., the second mechanism, as discussed in details (e.g., in connection with FIG. 9).

Figure 8B:
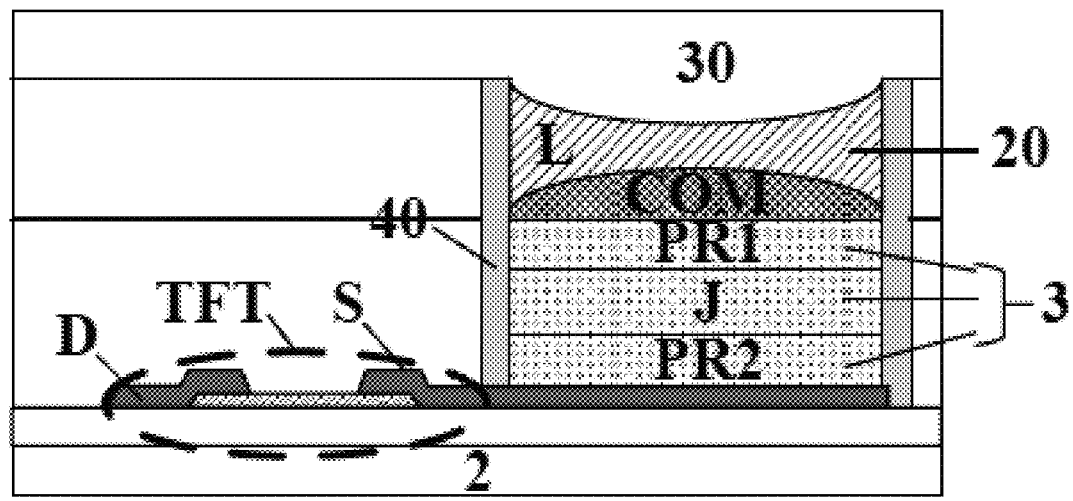
FIG. 8B is a schematic diagram illustrating the structure of a biometric sensor in some embodiments according to the present disclosure.

FIG. 8B is a schematic diagram illustrating the structure of a biometric sensor in some embodiments according to the present disclosure. Referring to FIG. 8B, in some embodiments, each of the plurality of light blocking walls 40 not only surrounds the lateral side LS of one of the plurality of photosensors 3, but also surround lateral sides of a common electrode COM and one of the plurality of concave lenses L.

In some embodiments, the plurality of light blocking walls 40 are formed so that each of the plurality of light blocking walls 40 surrounds the lateral side LS of one of the plurality of photosensors 3 and the lateral side of the common electrode, but does not surround the lateral side of the plurality of concave lenses L.

Figure 10A:
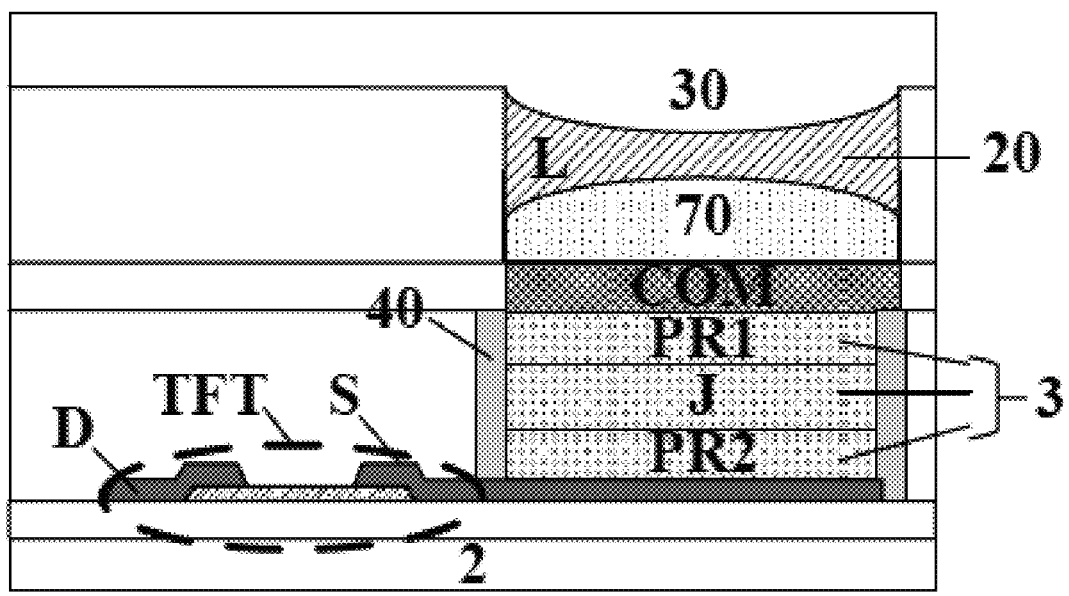
FIG. 10A is a schematic diagram illustrating the structure of a biometric sensor in some embodiments according to the present disclosure.

FIG. 10A is a schematic diagram illustrating the structure of a biometric sensor in some embodiments according to the present disclosure. Referring to FIG. 10A, in some embodiments, the biometric sensor further includes an intermediate layer 70 on a side of the low refractive index layer 20 distal to the high refractive index Layer 30. Each of the plurality of concave lenses Lis on a side of the intermediate layer 70 distal to one of the plurality of photosensors 3. In some embodiments, the high refractive index layer 30 has a refractive index of n1, the low refractive index layer 20 (e.g., the plurality of concave lenses L) has a refractive index of n2, and the intermediate layer 70 has a refractive index of n3. Optionally, $n1 > n2 > n3$. Optionally, the high refractive index layer 30 is directly adjacent to the low refractive index layer 20 (e.g., the plurality of concave lenses L) thereby firming a first interface (e g, the interface IF in FIG. 4), the low refractive index layer 20 (e.g., the plurality of concave lenses L) is directly adjacent to the intermediate layer 70 thereby forming a second interface. Light having an angle of incidence with respect to the first interface between the low refractive index Layer 20 (e.g., the plurality of concave lenses L) and the high refractive index layer 30 outside a first threshold range is prevented from entering into the low refractive index layer 20. The light having an angle of incidence with respect to the first interface within the first threshold range is allowed to enter into the low refractive index layer 20. Light having an angle of incidence with respect to the second interface between the low refractive index layer 20 (e.g., the plurality of concave lenses L) and the intermediate layer 70 outside a second threshold range is prevented from entering into the intermediate layer 70. The light having an angle of incidence with respect to the second interface within the second threshold range is allowed to eater into the intermediate layer 70.

Thus, the plurality of concave lenses L and the intermediate layer 70 exclude a portion of the reflected light reflected by the surface of the second base substrate facing away the first base substrate 2 from anteing into the plurality of photosensors 3 by a combination of at least three mechanisms. The first mechanism is due to the difference between refractive indexes of the high refractive index layer 30 and the plurality of concave lenses L The second mechanism is due to the diffusion function of the plurality of concave lenses L Even if the angle of incident is within the first threshold range, and the light is allowed to enter into the plurality of concave lenses L, the light entered into the plurality of concave lenses L is further diffused by the plurality of concave lenses L. A portion of light that has entered into the plurality of concave lenses L is excluded from reaching to the second interface between the plurality of concave lenses L and the intermediate Layer 70. The third mechanism is due to the difference between refractive indexes of the low refractive index layer 20 (e.g., the plurality of concave lenses L) and the intermediate layer 70. By having a combination of three mechanisms for excluding light from entering into the plurality of photosensors 3, it can be ensured that diffusely reflected light from adjacent subpixels that is diffusely reflected in regions corresponding to the plurality of ridge lines in the adjacent subpixels is prevented from entering into one of the plurality of photosensors 3 in the target subpixel.

Figure 10B:
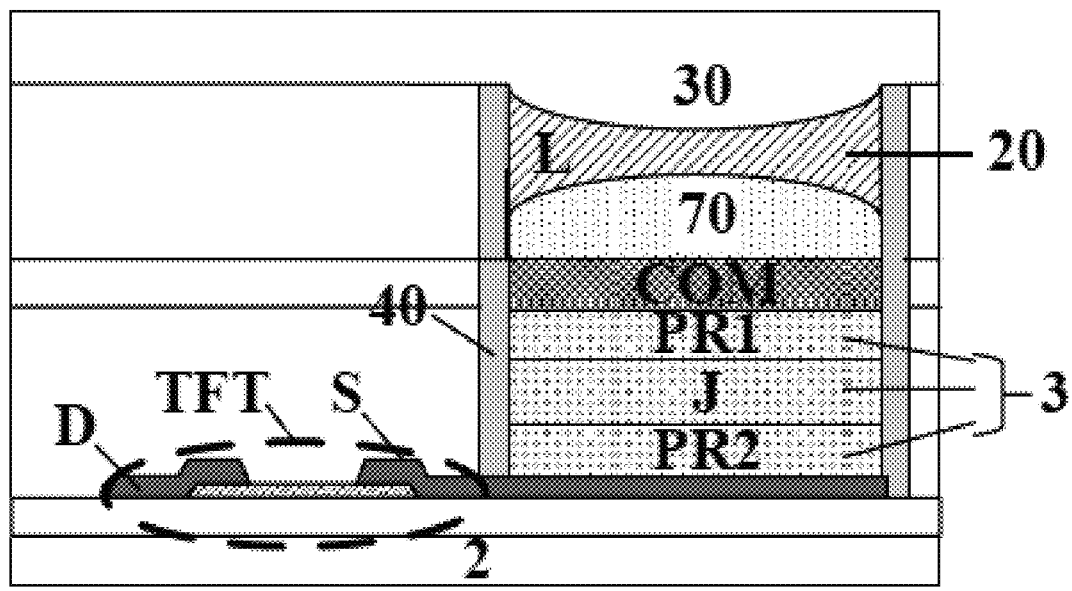
FIG. 10B is a schematic diagram illustrating the structure of a biometric sensor in some embodiments according to the present disclosure.

FIG. 10B is a schematic diagram illustrating the structure of a biometric sensor in some embodiments according to the present disclosure. Referring to FIG. 10B, in some embodiments, each of the plurality of light blocking walls 40 not only surrounds the lateral side LS of one of the plurality of photosensors 3, but also surround lateral sides of a common electrode COM, one of the plurality of concave lenses L, and the intermediate layer 70.

Figure 10C:
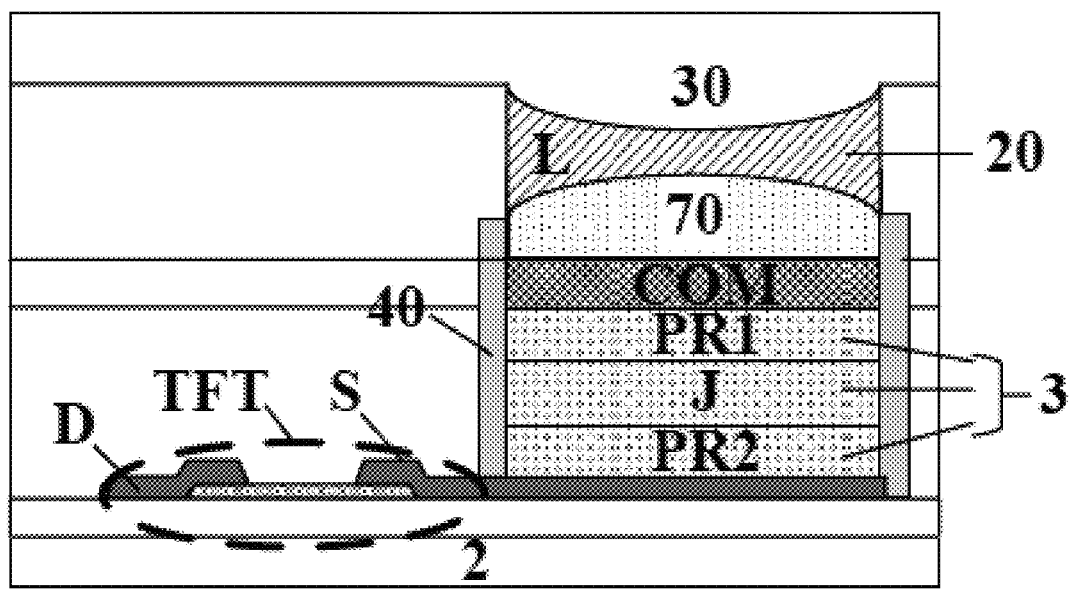
FIG. 10C is a schematic diagram illustrating the structure of a biometric sensor in some embodiments according to the present disclosure.

FIG. 10C is a schematic diagram illustrating the structure of a biometric sensor in some embodiments according to the present disclosure. Referring to FIG. 10C, in some embodiments, each of the plurality of light blocking walls 40 surrounds the lateral side LS of one of the plurality of photosensors 3, the lateral side of the common electrode COM, and the lateral side of the intermediate layer 70, but does not surround the lateral side of the plurality of concave lenses L.

In some embodiments, the plurality of light blocking walls 40 are formed so that each of the plurality of light blocking walls 40 surrounds the lateral side LS of one of the plurality of photosensors 3 and the lateral side of the common electrode COM, but does not surround the lateral sides of the plurality of concave lenses L and the intermediate layer 70.

Referring to FIGS. 3, 6A-6B, 7, 8A-8B and 10A-10C, the biometric sensor in some embodiments further includes an array of a plurality of thin film transistors TFTs our the first base substrate 2 and respectively connected to the plurality of photosensors 3, and a common electrode COM configured to be provided with a common voltage signal. Referring to FIG. 5, the biometric sensor in some embodiments further includes a plurality of read lines R for respectively transmitting signals detected by the plurality of photosensors 3. Optionally, each of the plurality of photosensors 3 includes a first polarity region PR1 connected to the common electrode COM, a second polarity region PR2 connected to a source electrode S of one of the plurality of thin film transistors TFTs, and a diode junction J connecting the first polarity region PR1 and the second polarity region PR2. Keening to FIG. 2 and FIGS. 3, 6A-6B, 7, 8A-8B and 10A-10C, in some embodiments, each of the plurality of thin film transistors TFTs includes a source electrode S connected to a second polarity region PR2 of one of the plurality of photosensors 3, and a drain electrode D connected to one of the plurality of read lines R.

Referring to FIG. 1 and FIG. 2, the biometric sensor in some embodiments further includes a light source 1 configured to emit a light irradiating along a direction from the first base substrate 2 toward the second base substrate 4, at least a portion of the light being totally reflected by a surface of the second base substrate 4 facing away the first base substrate 2.

In another aspect, the present disclosure provides a method of fabricating a biometric sensor. In some embodiments, the method includes providing a first base substrate; providing a second base substrate facing the first base substrate; forming a plurality of photosensors on the first base substrate and configured to detect at least a portion of the light totally reflected by the surface of the second base substrate facing away the first base substrate; forming a low refractive index layer on a side of the plurality of photosensors distal to the first base substrate; and forming a high refractive index layer on a side of the low refractive index layer distal to the first base substrate and directly adjacent to the low refractive index layer, the high refractive index layer is made of a material having a refractive index higher than a refractive index of a material of the low refractive index layer. In some embodiments, the low refractive index layer and the high refractive index layer are formed to exclude a portion of a reflected light reflected by the surface of the second base substrate facing away the first base substrate having an angle of incidence with respect to an interface between the low refractive index layer and the high refractive index layer outside a threshold range from entering into the plurality of photosensors. Optionally, the low refractive index layer and the high refractive index layer are formed to exclude at least a portion of a diffusely reflected light reflected by the surface of the second base substrate facing away the first base substrate having an angle of incidence with respect to the interface between the low refractive index layer and the high refractive index layer outside a threshold range from entering into the plurality of photosensors, and configured to allow at least a portion of the light totally reflected by the surface of the second base substrate facing away the first base subs having an angle of incidence with respect to the interface between the low refractive index layer and the high refractive index layer within the threshold range to enter into the plurality of photosensors.

In some embodiments, the method further includes forming a plurality of light blocking walls, each of which formed surrounding a lateral side of one of the plurality of photosensors to prevent light from emitting out of the lateral side. Optionally, the step of forming each of the light blocking walls includes forming a Bragg reflector including at least a first sub-layer of a high refractive index and a second sub-layer of a low refractive index surrounding the lateral side of the one of the plurality of photosensors. Optionally, the first sub-layer is made of a material having a refractive index higher than a refractive index of a material of the second sub-layer. Optionally, the first sub-layer is formed between the second sub-layer and the lateral side of the OM of the plurality of photosensors. Optionally, the first sub-layer is made of a material comprising hafnium oxide and the second sub-layer is made of a material comprising silicon oxide.

Optionally, each of the light blocking walls is made of a light absorbing polymer material.

In some embodiments, the step of forming the low refractive index layer includes forming a plurality of concave lenses configured to diffuse at least a portion of the reflected light reflected by the surface of the second base substrate facing away the first base substrate and transmitted toward the plurality of photosensors. Optionally, the high refractive index layer is made of a material having a refractive index higher than a refractive index of a material of the plurality of concave lens. Optionally, the plurality of concave lenses and the high refractive index layer are formed to exclude the portion of the reflected light reflected by the surface of the second base substrate facing away the first base substrate having the angle of incidence with respect to an interface between the plurality of concave lenses and the high refractive index layer outside the threshold range from entering into the plurality of photosensors. Optionally, each of the plurality of concave lenses is formed between one of the plurality of photosensors and the high refractive index layer.

In some embodiments, the method further includes forming an intermediate layer on a side of the low refractive index layer distal to the high refractive index layer. Optionally, the plurality of concave lenses are made of a material having a refractive index higher than a refractive index of a material of the intermediate layer. Optionally, each of the plurality of concave lenses is formed on a side of the intermediate layer distal to one of the plurality of photosensors. Optionally, the plurality of concave lenses and the intermediate layer are formed to exclude a light transmitted through the plurality of concave lenses from entering into the plurality of photosensors.

In some embodiments, the method further includes forming an army of a plurality of thin film transistors on the first base substrate and respectively connected to the plurality of photosensors. Optionally, the method further includes kerning a common electrode configured to be provided with a common voltage signal; and forming a plurality of read lines for respectively transmitting signals detected by the plurality of photosensors. Optionally, the common electrode is a substantially transparent electrode.

In some embodiments, the step of forming each of the plurality of photosensors includes forming a first polarity region connected to the common electrode, forming a second polarity region connected to a source electrode of one of the plurality of thin film transistors, and forming a diode junction connecting the first polarity region and the second polarity region. Optimally, the step of forming each of the plurality of thin film transistors includes forming a source electrode connected to a second polarity region of one of the plurality of photosensors and forming a drain electrode connected to one of the plurality of read line.

In some embodiments, the method further includes forming a light source configured to emit a light irradiating along a direction from the first base substrate toward the second base substrate, at least a portion of the light being reflected by a surface of the second base substrate facing away the first base substrate.

Optionally, each of the plurality of photosensors is a PIN photodiode formed to include a first polarity region, a second polarity region, and a diode junction, connecting the first polarity region and the second polarity region. Optionally, the first polarity region is a P+ doping semiconductor region, the second polarity region is an N+ doping semiconductor region, and the diode junction is an intrinsic region of amorphous silicon between the P+ doping semiconductor region and the N+ doping semiconductor region.

Optionally, the high refractive index layer is a passivation layer.

Optionally, the biometric sensor is a finger print sensor configured to detect a finger print, and the biometric information is a finger print information.

In another aspect, the present disclosure provides a display apparatus having the biometric sensor described herein or fabricated by a method described herein. Examples of appropriate display apparatuses include, but are not limited to, an electronic paper, a mobile phone, a tablet computer, a television, a monitor, a notebook computer, a digital album, a GPS, etc.

In some embodiments, the display apparatus has a plurality of subpixels Optionally, each of the plurality of photosensors corresponds to one or more of the plurality of subpixels. Optionally, each of the plurality of photosensors corresponds to N numbers of the plurality of subpixels, N≥1. Optionally, N=1, and each of the plurality of photosensors corresponds to one of the plurality of subpixels.

In some embodiments, the display apparatus has a subpixel region and an inter-subpixel region. Optionally, the plurality of photosensors are in the inter-subpixel region.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been

What is claimed is:
1. A biometric sensor, comprising:
a first base substrate;
a second base substrate facing the first base substrate;
a plurality of photosensors on the first base substrate and configured to detect at least a portion of a light totally reflected by a surface of the second base substrate facing away the first base substrate, thereby detecting a biometric information;
a low refractive index layer on a side of the plurality of photosensors distal to the first base substrate; and
a high refractive index layer on a side of the low refractive index layer distal to the first base substrate and directly adjacent to the low refractive index layer, the high refractive index layer comprising a material having a refractive index higher than a refractive index of a material of the low refractive index layer;
wherein the low refractive index layer and the high refractive index layer are configured to exclude a portion of a reflected light reflected by the surface of the second base substrate facing away the first base substrate having an angle of incidence with respect to an interface between the low refractive index layer and the high refractive index layer outside a threshold range from entering into the plurality of photosensors;
the low refractive index layer comprises a plurality of concave lenses configured to diffuse at least a portion of the reflected light reflected by the surface of the second base substrate facing away the first base substrate and transmitted toward the plurality of photosensors;
the high refractive index layer comprises a material having a refractive index higher than a refractive index of a material of the plurality of concave lens;
the plurality of concave lenses and the high refractive index layer are configured to exclude the portion of the reflected light reflected by the surface of the second base substrate facing away the first base substrate having the angle of incidence with respect to an interface between the plurality of concave lenses and the high refractive index layer outside the threshold range from entering into the plurality of photosensors; and
a respective one of the plurality of concave lenses is between a respective one of the plurality of photosensors and the high refractive index layer.

2. The biometric sensor of claim 1, further comprising a plurality of light blocking walls, a respective one of the plurality of light blocking walls surrounding a lateral side of the respective one of the plurality of photosensors to prevent light from emitting out of the lateral side.

3. The biometric sensor of claim 2, wherein the respective one of the plurality of light blocking walls comprises a Bragg reflector comprising at least a first sub-layer of a high refractive index and a second sub-layer of a low refractive index surrounding the lateral side of the respective one of the plurality of photosensors, the first sub-layer comprising a material having a refractive index higher than a material of the second sub-layer; and the first sub-layer is between the second sub-layer and the lateral side of the respective one of the plurality of photosensors.

4. The biometric sensor of claim 3, wherein the first sub-layer comprises hafnium oxide and the second sub-layer comprises silicon oxide.

5. The biometric sensor of claim 2, wherein the respective one of the plurality of light blocking walls comprises a light absorbing polymer material.

6. The biometric sensor of claim 1, further comprising an intermediate layer on a side of the low refractive index layer distal to the high refractive index layer;

the plurality of concave lenses comprise a material having a refractive index higher than a refractive index of a material of the intermediate layer; and the respective one of the plurality of concave lenses is on a side of the intermediate layer distal to the respective one of the plurality of photosensors.

7. The biometric sensor of claim 6, wherein the plurality of concave lenses and the intermediate layer are configured to exclude a light transmitted through the plurality of concave lenses from entering into the plurality of photosensors.

8. The biometric sensor of claim 1, further comprising an array of a plurality of thin film transistors on the first base substrate and respectively connected to the plurality of photosensors;

a common electrode configured to be provided with a common voltage signal; and a plurality of read lines for respectively transmitting signals detected by the plurality of photosensors.

9. The biometric sensor of claim 8, wherein the common electrode is a substantially transparent electrode.

10. The biometric sensor of claim 8, wherein the respective one of the plurality of photosensors comprises a first polarity region connected to the common electrode, a second polarity region connected to a source electrode of a respective one of the plurality of thin film transistors, and a diode junction connecting the first polarity region and the second polarity region; and a respective one of the plurality of thin film transistors comprises a source electrode connected to a second polarity region of the respective one of the plurality of photosensors, and a drain electrode connected to a respective one of the plurality of read lines.

11. The biometric sensor of claim 1, further comprising a light source configured to emit a light irradiating along a direction from the first base substrate toward the second base substrate, at least a portion of the light being totally reflected by a surface of the second base substrate facing away the first base substrate.

12. The biometric sensor of claim 1, wherein the respective one of the plurality of photosensors is a PIN photodiode comprising a first polarity region, a second polarity region, and a diode junction connecting the first polarity region and the second polarity region;

wherein the first polarity region is a P+ doping semiconductor region, the second polarity region is an N+ doping semiconductor region, and the diode junction is an intrinsic region of amorphous silicon between the P+ doping semiconductor region and the N+ doping semiconductor region.

13. The biometric sensor of claim 1, wherein the high refractive index layer is a passivation layer.

14. The biometric sensor of claim 1, wherein the low refractive index layer and the high refractive index layer are configured to exclude at least a portion of a diffusely reflected light reflected by the surface of the second base substrate facing away the first base substrate having an angle of incidence with respect to the interface between the low refractive index layer and the high refractive index layer outside a threshold range from entering into the plurality of photosensors, and configured to allow at least a portion of the light totally reflected by the surface of the second base substrate facing away the first base substrate having an angle of incidence with respect to the interface between the low refractive index layer and the high refractive index layer within the threshold range to enter into the plurality of photosensors.

15. The biometric sensor of claim 1, wherein the biometric sensor is a finger print sensor configured to detect a finger print, and the biometric information is a finger print information.

16. A display apparatus, comprising the biometric sensor of claim 1.

17. The display apparatus of claim 16, wherein the display apparatus has a plurality of subpixels; and a respective one of the plurality of photosensors corresponds to a respective one of the plurality of subpixels.

18. The display apparatus of claim 16, wherein the display apparatus has a subpixel region and an inter-subpixel region; and the plurality of photosensors are in the inter-subpixel region.

19. A method of fabricating a biometric sensor, comprising:

providing a first base substrate;

providing a second base substrate facing the first base substrate;

forming a plurality of photosensors on the first base substrate and configured to detect at least a portion of a light totally reflected by a surface of the second base substrate facing away the first base substrate, thereby detecting a biometric information;

forming a low refractive index layer on a side of the plurality of photosensors distal to the first base substrate; and forming a high refractive index layer on a side of the low refractive index layer distal to the first base substrate and directly adjacent to the low refractive index layer, the high refractive index layer is made of a material having a refractive index higher than a refractive index of a material of the low refractive index layer;

wherein the low refractive index layer and the high refractive index layer are formed to exclude a portion of a reflected light reflected by the surface of the second base substrate facing away the first base substrate having an angle of incidence with respect to an interface between the low refractive index layer and the high refractive index layer outside a threshold range from entering into the plurality of photosensors;

forming the low refractive index layer comprises forming a plurality of concave lenses configured to diffuse at least a portion of the reflected light reflected by the surface of the second base substrate facing away the first base substrate and transmitted toward the plurality of photosensors;

the high refractive index layer is made of a material having a refractive index higher than a refractive index of a material of the plurality of concave lens;

the plurality of concave lenses and the high refractive index layer are formed to exclude the portion of the reflected light reflected by the surface of the second base substrate facing away the first base substrate having the angle of incidence with respect to an interface between the plurality of concave lenses and the high refractive index layer outside the threshold range from entering into the plurality of photosensors; and a respective one of the plurality of concave lenses is formed between a respective one of the plurality of photosensors and the high refractive index layer.

* * * * *